United States Patent
Masuda

(10) Patent No.: US 11,467,221 B2
(45) Date of Patent: Oct. 11, 2022

(54) DEGRADATION-DETERMINATION SYSTEM AND METHOD FOR DETERMINING DEGRADATION OF SECONDARY BATTERY

(71) Applicant: MINEBEA MITSUMI Inc., Nagano (JP)

(72) Inventor: Shigemi Masuda, Shizuoka (JP)

(73) Assignee: MINEBEA MITSUMI Inc., Nagano (JP)

(*) Notice: Subject to any disclaimer, the term of this patent is extended or adjusted under 35 U.S.C. 154(b) by 13 days.

(21) Appl. No.: 17/260,733

(22) PCT Filed: Aug. 2, 2019

(86) PCT No.: PCT/JP2019/030528
§ 371 (c)(1),
(2) Date: Jan. 15, 2021

(87) PCT Pub. No.: WO2020/031900
PCT Pub. Date: Feb. 13, 2020

(65) Prior Publication Data
US 2021/0270908 A1    Sep. 2, 2021

(30) Foreign Application Priority Data

Aug. 6, 2018   (JP) .............................. JP2018-147714

(51) Int. Cl.
*G01R 31/392*    (2019.01)
*G01L 1/20*    (2006.01)
(Continued)

(52) U.S. Cl.
CPC ............ *G01R 31/392* (2019.01); *G01L 1/205* (2013.01); *G01L 1/22* (2013.01); *H01M 10/48* (2013.01); *H02J 7/0047* (2013.01)

(58) Field of Classification Search
None
See application file for complete search history.

(56) References Cited

U.S. PATENT DOCUMENTS

| | | | |
|---|---|---|---|
| 9,046,956 B2 | 6/2015 | Koizumi et al. | |
| 2011/0039137 A1* | 2/2011 | Engle .................. | H01M 10/486 |
| | | | 429/90 |
| 2017/0098872 A1 | 4/2017 | Sood et al. | |

FOREIGN PATENT DOCUMENTS

| | | |
|---|---|---|
| JP | 2013-020826 | 1/2013 |
| JP | 2013-122907 | 6/2013 |

(Continued)

OTHER PUBLICATIONS

Extended European Search Report dated Jun. 23, 2021 with respect to the corresponding European Patent Application No. 19847016.3.
(Continued)

*Primary Examiner* — Jas A Sanghera
(74) *Attorney, Agent, or Firm* — IPUSA, PLLC

(57) ABSTRACT

A degradation-determination system includes at least four strain gauges that are installed on a principal surface of a lithium-ion battery and each of which is configured to detect pressure of a battery surface at a corresponding installation position, and a degradation determining unit configured to determine degradation of the lithium-ion battery based on measured values at the strain gauges. The degradation determining unit is configured to estimate a maximum expansion position where volume expansion is maximal in a region defined by the strain gauges, of the surface of the lithium-ion battery.

5 Claims, 2 Drawing Sheets

(51) Int. Cl.
*G01L 1/22* (2006.01)
*H01M 10/48* (2006.01)
*H02J 7/00* (2006.01)

(56) References Cited

FOREIGN PATENT DOCUMENTS

| | | |
|---|---|---|
| JP | 2016-134259 | 7/2016 |
| JP | 2018-081854 | 5/2018 |
| WO | 2010/122824 | 10/2010 |
| WO | 2017/033013 | 3/2017 |

OTHER PUBLICATIONS

International Search Report for PCT/JP2019/030528 dated Oct. 15, 2019.

* cited by examiner

DEGRADATION-DETERMINATION SYSTEM AND METHOD FOR DETERMINING DEGRADATION OF SECONDARY BATTERY

TECHNICAL FIELD

The present disclosure relates to a degradation-determination system and a method for determining degradation of a secondary battery.

BACKGROUND

Secondary batteries such as lithium-ion batteries have higher energy density, and are compact and lightweight. For this reason, such secondary batteries are widely used in electricity storage systems such as electric vehicles or smartphones.

Repeated charging and discharging causes lithium-ion batteries to degrade. In the past, an approach for determining degradation of a battery by measuring pressure of a principal surface of the battery has been proposed (for example, Patent document 1).

CITATION LIST

Patent Document

[Patent document 1] Japanese Unexamined Patent Application Publication No. 2018-81854

SUMMARY

For the conventional approach for determining degradation described in Patent document 1 or the like, variations in pressure of the whole principal surface of a lithium-ion battery are monitored, and it is only determined whether degradation of the battery occurs. However, for purposes of improvement or the like of the safety of the battery, there is a need to identify a position where volume expansion of the principal surface is maximal to thereby locally identify a position of degradation of the battery.

An objective of the present disclosure is to provide a degradation-determination system and a method for determining degradation of a secondary battery that are capable of locally identifying a position of degradation of a battery.

According to one aspect of one or more embodiments of the present disclosure, a degradation-determination system for a secondary battery includes at least four pressure detecting units that are installed on one or more surfaces of the secondary battery and each of which is configured to detect pressure of a battery surface at a corresponding installation position, and a degradation determining unit configured to determine degradation of the secondary battery based on measured values at the at least four pressure detecting units. The degradation determining unit is configured to estimate a volume expansion position where volume expansion is maximal in a region defined by the at least four pressure detecting units, of the one or more surfaces of the secondary battery.

Likewise, according to one aspect of one or more embodiments of the present disclosure, a method for determining degradation of a secondary battery includes a pressure-detection step of detecting pressure of a battery surface at a corresponding installation position, by each of at least four pressure detecting units installed on one or more surfaces of the secondary battery, and a degradation-determination step of determining degradation of the secondary battery based on measured values at the at least four pressure detecting units. In the degradation-determination step, a volume expansion position where volume expansion is maximal in a region defined by the at least four pressure detecting units, of the one or more surfaces of the secondary battery, is estimated.

Effects of the Invention

According to the present disclosure, a degradation-determination system and a method for determining degradation of a secondary battery that are capable of locally identifying a position of degradation of a battery, can be provided.

DESCRIPTION OF EMBODIMENTS

One or more embodiments will be hereafter described with reference to the accompanying drawings. In order to facilitate the understanding of explanation, in each figure, the same numerals denote the same components to the extent possible, and duplicative descriptions for the components will be omitted.

Figure 1:
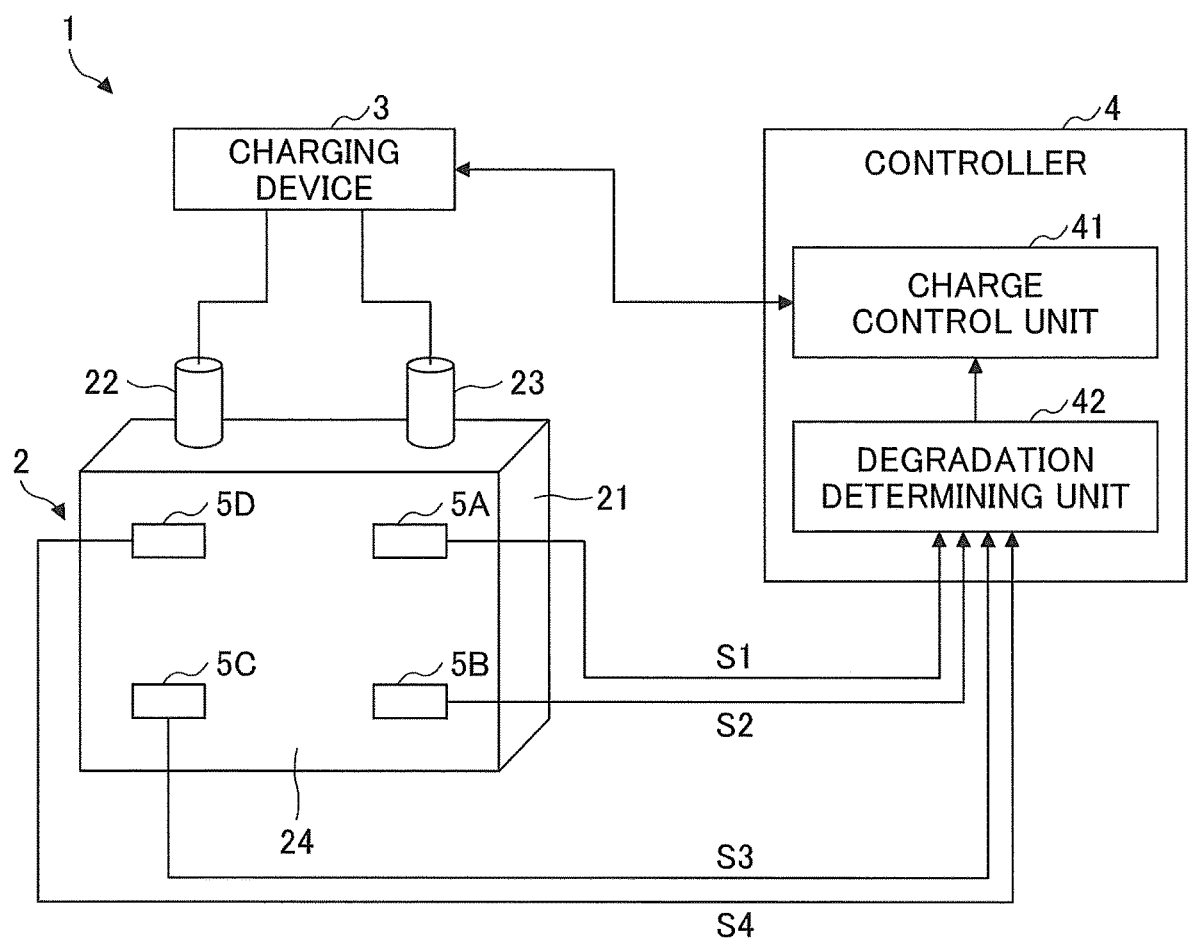
FIG. 1 is a block diagram schematically illustrating the configuration of a degradation-determination system according to an embodiment.
Figure 2:
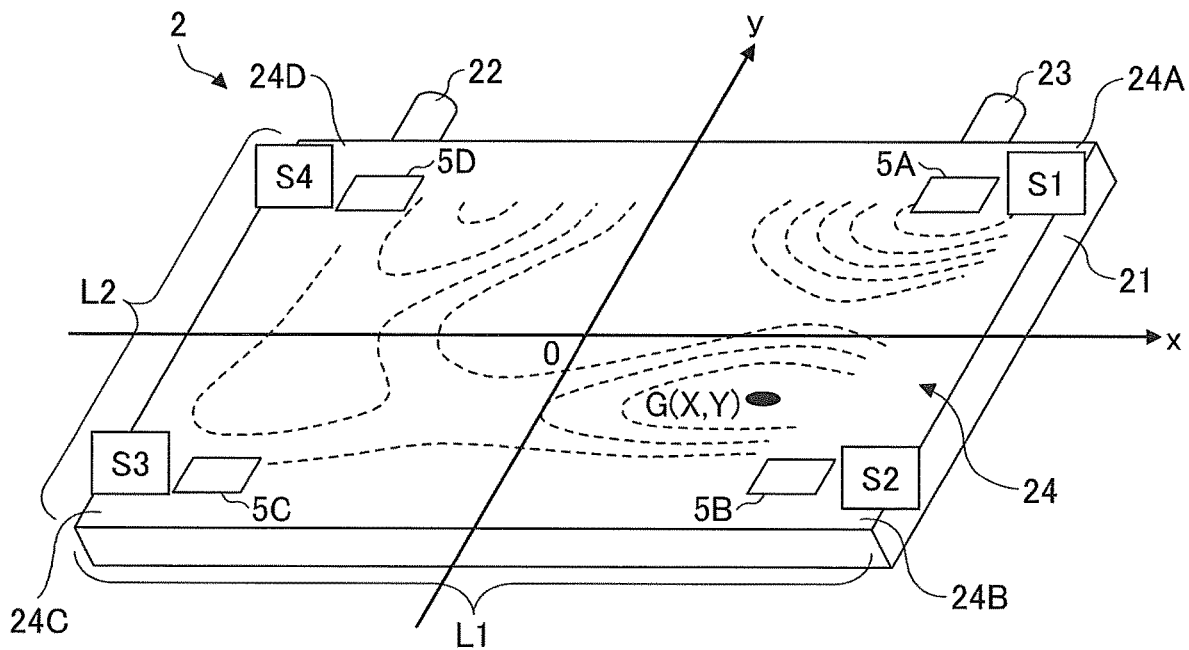
FIG. 2 is a schematic diagram for describing an approach for estimating a local position of degradation of a lithium-ion battery.

FIG. 1 is a block diagram schematically illustrating the configuration of a degradation-determination system 1 according to the embodiment. FIG. 2 is a schematic diagram for describing an approach for estimating a local position G of degradation of a lithium-ion battery 2. The degradation-determination system 1 determines degradation of the lithium-ion battery 2 as an example of a secondary battery. As illustrated in FIG. 1, the degradation-determination system 1 includes a charging device 3, a controller 4, and strain gauges 5A to 5D (pressure detecting units).

The lithium-ion battery 2 has the configuration illustrated in the example in FIG. 1, and is coated with a thin, substantially cuboidal housing 21 having a pair of principal surfaces 24. In FIG. 1, the pair of principal surfaces 24 of the housing 21 is disposed so as to face each other along a depth direction in the figure. Each principal surface is approximately rectangularly shaped, and a positive terminal 22 and a negative terminal 23 are provided on one (upper surface in FIG. 1) among four side surfaces of the housing 21 that are each perpendicular to the principal surface 24. One end of each of the positive terminal 22 and the negative terminal 23 protrudes outward from the housing 21, and is connected to the charging device 3. The lithium-ion battery 2 may be a single cell as illustrated in FIG. 1, or an assembled battery in which a plurality of single cells as illustrated in FIG. 1 are connected together.

The charging device 3 is connected to the positive terminal 22 and the negative terminal 23 of the lithium-ion battery 2, and charges the lithium-ion battery 2 via the positive terminal 22 and the negative terminal 23. For example, the charging device 3 stores a set value indicative of an upper limit (factor of safety) of a charge tolerance that corresponds to the extent of degradation of the battery. The charging device 3 can charge the battery to the upper limit while referring the remaining battery capacity. The charging device 3 also outputs data, such as a time required to fully charge the battery, to the controller 4.

The controller 4 controls charging through the charging device 3. The controller 4 also estimates a local position G (see FIG. 2) of degradation of the lithium-ion battery 2, based on information input from the strain gauges 5A to 5D. For these related functions, the controller 4 has a charge control unit 41 and a degradation determining unit 42.

The charge control unit 41 controls the charging process of the lithium-ion battery 2 by the charging device 3. The charge control unit 41 adjusts the charging time or the voltage value. In order for the battery to operate more stably, the charge control unit 41 appropriately adjusts one or more parameters related with the charge of the lithium-ion battery 2, based on the position G of degradation estimated by the degradation determining unit 42, and then may output the parameters to the charging device 3.

The degradation determining unit 42 estimates the local position G of degradation of the lithium-ion battery 2, based on measured values S1 to S4 at the strain gauges 5A to 5D. The local position G of degradation refers to a local portion of the principal surface 24 of the lithium-ion battery 2 where the largest degradation occurs. The degradation determining unit 42 estimates a maximum expansion position G where volume expansion is maximal in a region defined by the strain gauges 5A to 5D, in the principal surface 24 of the lithium-ion battery 2, and then outputs the maximum expansion position G as the local position G of degradation. A specific approach for estimating the position G of degradation will be described below.

The controller 4 may be implemented by any hardware, software, or a combination thereof. The controller 4 may be mainly comprised of a microcomputer including, for example, a central processing unit (CPU), a random access memory (RAM), a read only memory (ROM), an auxiliary storage device, an input-output interface (I/O), and the like. The various functions described above are implemented by executing various programs, which are stored in the ROM, the auxiliary storage device, or the like, on the CPU.

Each of the strain gauges 5A to 5D is installed on the surface of the lithium-ion battery 2 and outputs a given electrical signal among electrical signals S1 to S4, in accordance with strain of a corresponding installation portion, as illustrated in FIG. 2. As each of the strain gauges 5A to 5D, any type of strain gauge, such as a metal strain gauge or a semiconductor strain gauge, may be adopted.

The strain gauges 5A to 5D are respectively installed at four corner regions 24A to 24D (hereafter also denoted as corners 24A to 24D) of the principal surface 24 (surface) of the cuboidal lithium-ion battery 2, as illustrated in an example in FIG. 2. In the present embodiment, the strain gauge 5A is installed at the corner 24A that is on the side of the negative terminal 23 relative to the middle portion of the principal surface 24 and that is near the negative terminal 23. The strain gauge 5B is installed at the corner 24B that is on the side of the negative terminal 23 relative to the middle portion of the principal surface 24 and that is far from the negative terminal 23. The strain gauge 5C is installed at the corner 24C that is on the side of the positive terminal 22 relative to the middle portion of the principal surface 24 and that is far from the positive terminal 22. The strain gauge 5D is installed at the corner 24D that is on the side of the positive terminal 22 relative to the middle portion of the principal surface 24 and that is near the positive terminal 22.

Strains S1 to S4 (hereafter also denoted as measured values S1 to S4 at the strain gauges 5A to 5D) detected by the respective strain gauges 5A to 5D each correspond to a slight mechanical change that is made in accordance with a force (load) applied to a corresponding installation portion. When the volume of the lithium-ion battery 2 expands, a load is applied to the housing 21 of the lithium-ion battery 2, from the inside to the outside of the housing, and thus pressure of the surface of the housing 21 is increased. When the surface pressure of the lithium-ion battery 2 is increased, the strains S1 to S4 detected by the strain gauges 5A to 5D are increased accordingly. The degree of volume expansion at the respective positions of the battery varies in accordance with the extent of degradation at the position. A distribution for the volume expansion is shown on the principal surface 24, as represented by dotted lines in FIG. 2. At the local position G of degradation where the largest degradation of the battery occurs, the degree of the volume expansion of the battery also becomes maximal. The strains S1 to S4 at the strain gauges 5A to 5D that are disposed at the four corners of the principal surface 24 each differ depending on the position of the principal surface 24 that is such a maximum expansion position G (i.e., local position of degradation) where volume expansion is maximal.

Now, as illustrated in FIG. 2, a two-dimensional coordinate system in which the center of the principal surface 24 is given as the origin O, an extension direction of one side on which the positive terminal 22 and the negative terminal 23 are provided is the x-axis direction, and a direction perpendicular to the x-axis direction is the y-axis direction, is considered. In the two-dimensional coordinate system, the strain gauge 5A is disposed in a first quadrant, the strain gauge 5D is disposed in a second quadrant, the strain gauge 5C is disposed in a third quadrant, and the strain gauge 5B is disposed in a fourth quadrant.

In such a two-dimensional coordinate system, for example, when the maximum expansion position G is at the origin O, each of the strain gauges 5A to 5D is approximately at the same distance from the origin O. Thus, the gauges 5A to 5D tend to output the respective measured values S1 to S4 each indicating approximately the same value. Note that after degradation of the battery is accelerated greatly, the maximum expansion position G tends to be localized at the approximately middle portion of the principal surface 24. In contrast, when the maximum expansion position G is situated on an x-positive direction side relative to the origin O, the measured values S1 and S2 at the strain gauges 5A and 5B that are at the corners 24A and 24B near the maximum expansion position G tend to be greater than the measured values S3 and S4 at the other strain gauges 5C and 5D. Also, when the maximum expansion position G is situated on an x-negative direction side relative to the origin O, the measured values S3 and S4 at the strain gauges 5C and 5D that are at the corners 24C and 24D near the maximum expansion position G tend to be greater than the measured values S1 and S2 at the other strain gauges 5A and 5B. The above trends are also applied with respect to the y-axis direction. Accordingly, in the present embodiment, characteristics of such measured values S1 to S4 at the strain gauges 5A to 5D are used to estimate the maximum expansion position G of the lithium-ion battery 2, i.e., the local position G of degradation.

More specifically, the degradation determining unit 42 of the controller 4 uses the following equation (1) and equation (2) to calculate, for the maximum expansion position G, an X-coordinate with respect to the x-axis direction, and a Y-axis coordinate with respect to the y-axis direction, based on the measured values S1 to S4.

[Math. 1]
$$X = \frac{L1\{(S1+S2)-(S3+S4)\}}{\sum_{i=1}^{4} S_i} \quad (1)$$

[Math. 2]
$$Y = \frac{L2\{(S1+S4)-(S2+S3)\}}{\sum_{i=1}^{4} S_i} \quad (2)$$

Where, L1 is a length of the side of the principal surface 24 in the x-axis direction, and L2 is a length of the side of the principal surface 24 in the y-axis direction.

In Equation (1) above, a difference between the sum S1+S2 of the measured values at the two strain gauges 5A and 5B, which are arranged on the positive side of the x-axis of the two-dimensional coordinate system, and the sum S3+S4 of the measured values at the two strain gauges 5C and 5D, which are arranged on the negative side of the x-axis, is calculated, and a deviation amount with respect to the x-axis direction from the origin O of the principal surface 24 is calculated based on the calculated difference. The calculated deviation amount with respect to the x-axis direction is calculated as the X-coordinate of the maximum expansion position G.

The calculated difference is divided by the total sum of the measured values S1 to S4 to be normalized to a numerical value near 0. Then, by multiplying the value by the length L1 of the side of the principal surface 24 in the x-axis direction, Equation (1) is formulated such that the calculated X-coordinate falls within the range between a given x-axis position of each of the strain gauges 5A and 5B, and a given x-axis position of each of the strain gauges 5C and 5D.

Likewise, in Equation (2) above, a difference between the sum S1+S4 of the measured values at the two strain gauges 5A and 5D, which are arranged on the positive side of the y-axis of the two-dimensional coordinate system, and the sum S2+S3 of the measured values at the two strain gauges 5B and 5C, which are arranged on the negative side of the y-axis, is calculated, and a deviation amount with respect to the y-axis direction from the origin O of the principal surface 24 is calculated based on the calculated difference. The calculated deviation amount with respect to the y-axis direction is calculated as the Y-coordinate of the maximum expansion position G.

As in Equation (1), the calculated difference is divided by the total sum of the measured values S1 to S4 to be normalized to a numerical value near 0. Then, by multiplying the value by the length L2 of the side of the principal surface 24 in the y-axis direction, Equation (2) is formulated such that the calculated Y-coordinate falls within the range between a given y-axis position of each of the strain gauges 5A and 5D, and a given y-axis position of each of the strain gauges 5B and 5C.

The maximum expansion position G calculated by Equations (1) and (2) above is a position where volume expansion is maximal in a region defined by the strain gauges 5A to 5D. In such a case, at least four strain gauges 5A to 5D need to be installed. However, a configuration in which more than four strain gauges are installed to improve accuracy for estimation of the position G of degradation, may be used.

For example, when additional four strain gauges are each disposed at an intermediate position (around the midpoint of each of the four sides of the principal, surface 24) of given strain gauges among the four strain gauges 5A to 5D that are installed at the four corners, the number of sensors is doubled in a section having approximately the same size as that defined in the case of the four strain gauges only. Accordingly, the position of degradation can be estimated more accurately.

Figure 3:
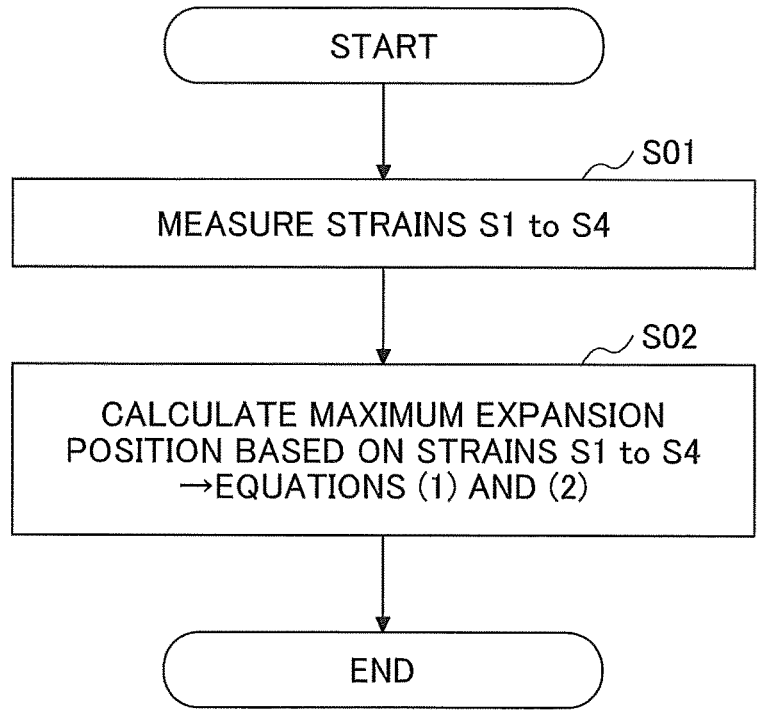
FIG. 3 is a flowchart illustrating the procedure for a degradation-determination process of the lithium-ion battery.

Referring to FIG. 3, a method for determining degradation at the degradation-determination system 1 according to the embodiment will be described. FIG. 3 is a flowchart illustrating a procedure for a degradation-determination process of the lithium-ion battery 2 performed by the degradation-determination system 1 according to the embodiment. The process related with the flowchart in FIG. 3 is executed by the controller 4.

In step S01 (pressure-detection step), strains S1 to S4 at the four corners 24A to 24D of the principal surface 24 of the lithium-ion battery 2 are respectively measured by the strain gauges 5A to 5D. The measured strains S1 to S4 are each output to the degradation determining unit 42.

In step S02 (degradation-determination step), the degradation determining unit 42 uses Equation (1) and Equation (2) above to calculate X and Y coordinates of the maximum expansion position G where volume expansion of the principal surface 24 is maximal, based on the strain measured values S1 to S4 measured in step S01. The degradation determining unit 42 outputs the maximum expansion position G as the local position G of degradation where the largest degradation of the battery occurs. When the process in step S02 is completed, the control flow ends.

Note that after the local position G of degradation is calculated in step S02, control (such as utilizing of information indicating the position of degradation, as control information in a battery management system (BMS)) related with the charge may be performed by the charge control unit 41, such that safety of the lithium-ion battery 2 can be improved.

As described above, the degradation-determination system 1 according to the present embodiment includes at least four strain gauges 5A to 5D that are installed on the principal surface 24 of the lithium-ion battery 2 and each of which detects the pressure of the battery surface at a corresponding installation position. The degradation-determination system 1 also includes the degradation determining unit 42 that determines degradation of the lithium-ion battery 2 based on the measured values S1 to S4 at the strain gauges 5A to 5D. The degradation determining unit 42 estimates the maximum expansion position G where volume expansion is maximal in a given region defined by the strain gauges 5A to 5D, of the surface of the lithium-ion battery 2.

With such a configuration, based on the measured values S1 to S4 at the strain gauges 5A to 5D, the maximum expansion position G of the principal surface 24 of the lithium-ion battery 2, i.e., the position G of degradation where the largest degradation of the battery occurs, can be locally identified. When the position G of degradation of the lithium-ion battery 2 can be locally identified, it can be utilized as big data to be used for analyzing or the like of a mechanism for occurrence of degradation of the lithium-ion battery 2. Further, a process, such as control for preventing the charging in accordance with a state of health of the lithium-ion battery 2, can be performed more accurately by using information indicating the identified position G of degradation. For this reason, safety of the lithium-ion battery 2 can be improved, which leads to increased life of the lithium-ion battery 2.

In the present embodiment, instead of directly measuring a given strain at each position of the principal surface 24 of the battery to thereby identify a position where the greatest strain occurs, coordinates of the local position G of degradation are calculated based on the measured values S1 to S4 at the four strain gauges 5A to 5D that are installed at the four corners of the principal surface 24. With such a manner, when at least four strain gauges 5A to 5D are installed, a given position of degradation can be identified. Accordingly, the number of required sensors can be reduced.

Further, in the degradation-determination system 1 according to the present embodiment, coordinates G (x, y) of the maximum expansion position are calculated using Equation (1) and Equation (2) described above. Thus, the local position G of degradation of the lithium-ion battery 2 can be estimated more accurately based on information indicating the measured values S1 to S4 at the strain gauges 5A to 5D.

Additionally, in the degradation-determination system 1 according to the present embodiment, the local position G of degradation of the battery surface is estimated based on the measured values S1 to S4 at the strain gauges 5A to 5D that are installed on the surface of the lithium-ion battery 2. In such a manner, relatively inexpensive strain gauges 5A to 5D are used, resulting in a low-cost way.

Moreover, in the degradation-determination system 1 according to the present embodiment, the strain gauges 5A to 5D are respectively installed at the four corner regions 24A to 24D of the approximately rectangular principal surface 24 of the lithium-ion battery 2. With such a manner, the section in which the local position G of degradation is able to be estimated can be maximized.

The present embodiment has been described above with reference to the specific examples. However, the present disclosure is not limited to these specific examples. Modifications to the specific examples to which those skilled in the art would make design changes as appropriate are also included within a scope the present disclosure as long as they have features of the present disclosure. Elements provided in the specific examples described above, arrangement, conditions, shape, and the like thereof are not limited to the examples and can be modified as appropriate. For the elements provided in the above-described specific examples, a combination thereof can be modified as appropriate, unless there is technical inconsistency.

In the above embodiments, the configuration in which the local position G of degradation of the battery is estimated based on the measured values S1 to S4 at the strain gauges 5A to 5D that are installed on the battery surface, is illustrated. However, when variations in surface pressure of a given battery can be measured, another pressure detecting unit such as a pressure sensor other than the strain gauge, may be used.

Further, in the above embodiments, the configuration in which the strain gauges 5A to 5D are installed at the four corner regions of the principal surface 24 of the lithium-ion battery 2, is illustrated. However, when at least four strain gauges are disposed, installation positions of the strain gauges 5A to 5D may be positions other than the four corners of the principal surface 24. The strain gauges 5A to 5D may be also disposed on one surface (side surface or top surface) other than the principal surface 24, of the surfaces of the lithium-ion battery 2.

In the above embodiments, the lithium-ion battery 2 is used as an example of a target for which degradation is determined. However, another secondary battery such as a nickel hydride battery or a lead battery can be adopted.

This International Application claims priority to Japanese Patent Application No. 2018-147714, filed Aug. 6, 2018, the contents of which are incorporated herein by reference in their entirety.

REFERENCE SIGNS LIST

1 degradation-determination system
2 lithium-ion battery (secondary battery)
3 charging device
4 controller
5A to 5D strain gauge (pressure detecting unit)
21 housing
22 positive terminal
23 negative terminal
24 principal surface
24A to 24D corner
41 charge control unit
42 degradation determining unit
step S01 pressure-detection step
step S02 degradation-determination step
S1 to S4 measured value
G maximum expansion position
L1 side length in x-axis direction
L2 side length in y-axis direction

The invention claimed is:

1. A degradation-determination system for a secondary battery comprising:
    four strain gauges respectively installed at four corners of an approximately rectangularly shaped principal surface of one or more surfaces of the secondary battery, each of the strain gauges being configured to detect pressure of a battery surface at a corresponding installation position, and a position of each strain gauge being represented by two-dimensional coordinates of the principal surface of the secondary battery; and
    a degradation determining unit configured to determine degradation of the secondary battery based on measured values by the four strain gauges,
    wherein the degradation determining unit is configured to estimate, based on the measured values by the four strain gauges and coordinate positions of the four strain gauges, a maximum expansion position where volume expansion is maximal in a region defined by the four strain gauges, of the one or more surfaces of the secondary battery.

2. The degradation-determination system for a secondary battery according to claim 1, wherein the four strain gauges are disposed on one surface of the one or more surfaces of the secondary battery, and
    wherein the degradation determining unit is configured to:
        set a two-dimensional coordinate system such that a center of the one surface is given as the origin and the four strain gauges are disposed in respective quadrants;
        calculate a difference between the sum of measured values at two strain gauges that are arranged on a positive side of an x-axis of the two-dimensional coordinate system and that are among the strain gauges, and the sum of measured values at two strain gauges that are arranged on a negative side of the x-axis of the two-dimensional coordinate system, and calculate a deviation amount from the center with respect to an x-axis direction, based on the difference;

calculate a difference between the sum of measured values at two strain gauges that are arranged on a positive side of a y-axis of the two-dimensional coordinate system and that are among the strain gauges, and the sum of measured values at two strain gauges that are arranged on a negative side of the y-axis of the two-dimensional coordinate system, and calculate a deviation amount from the center with respect to a y-axis direction, based on the difference; and calculate coordinates of the maximum expansion position, based on the deviation amount with respect to the x-axis direction and the deviation amount with respect to the y-axis direction.

3. The degradation-determination system for a secondary battery according to claim 2, wherein the secondary battery is a lithium-ion battery.

4. The degradation-determination system for a secondary battery according to claim 1, wherein the secondary battery is a lithium-ion battery.

5. A method for determining degradation of a secondary battery, the method comprising:

detecting pressure of a battery surface at a corresponding installation position, by each of four strain gauges installed at respective four corners of an approximately rectangularly shaped principal surface of one or more surfaces of the secondary battery, a position of each strain gauge being represented by two-dimensional coordinates of the principal surface of the secondary battery; and determining degradation of the secondary battery based on measured values by the four strain gauges, wherein in the determining of the degradation, a maximum expansion position where volume expansion is maximal in a region defined by the four strain gauges, of the one or more surfaces of the secondary battery, is estimated based on the measured values by the four strain gauges and coordinate positions of the four strain gauges.

* * * * *